United States Patent
Hwang

(10) Patent No.: US 7,282,442 B2
(45) Date of Patent: Oct. 16, 2007

(54) CONTACT HOLE STRUCTURE OF SEMICONDUCTOR DEVICE AND METHOD OF FORMING THE SAME

(75) Inventor: Sang Il Hwang, Wonju-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/598,709

(22) Filed: Nov. 14, 2006

(65) Prior Publication Data

US 2007/0111495 A1    May 17, 2007

(30) Foreign Application Priority Data

Nov. 15, 2005    (KR) ............... 10-2005-0108967

(51) Int. Cl.
*H01L 21/4763* (2006.01)
(52) U.S. Cl. .............. 438/637; 438/597; 438/667; 438/672; 438/675; 257/E21.585
(58) Field of Classification Search ........... 438/637, 438/597, 667, 672, 675
See application file for complete search history.

(56) References Cited

U.S. PATENT DOCUMENTS

2002/0155699 A1* 10/2002 Ueda ................ 438/637
2005/0180217 A1* 8/2005 Ding ................ 365/185.24
2005/0201155 A1* 9/2005 Shih ................. 365/185.16
2006/0202340 A1* 9/2006 Park et al. ............. 257/758

* cited by examiner

*Primary Examiner*—Asok K. Sarkar
*Assistant Examiner*—Victor V. Yevsikov
(74) *Attorney, Agent, or Firm*—Finnegan, Henderson, Farabow, Garrett, & Dunner, L.L.P.

(57) ABSTRACT

A method of forming a contact hole of a semiconductor device, the method comprising: forming a gate line and a source/drain region in a substrate; depositing an etch stopper layer on the substrate; depositing a first interlayer dielectric layer on the etch stopper layer and flattening the first interlayer dielectric layer exposing a portion of the etch stopper layer; removing the exposed portion of the etch stopper layer; forming a gate protective layer on the gate line; depositing a second interlayer dielectric layer on the substrate; and etching the second interlayer dielectric layer to form a first contact hole on the gate line and etching the second interlayer dielectric layer, the first interlayer dielectric layer, and the etch stopper layer to form a second contact hole on the source/drain region, wherein the gate protective layer protects the gate line during the formation of the first and second contact holes.

16 Claims, 5 Drawing Sheets

CONTACT HOLE STRUCTURE OF SEMICONDUCTOR DEVICE AND METHOD OF FORMING THE SAME

RELATED APPLICATION

This application is based upon and claims the benefit of priority to Korean Application No. 10-2005-0108967, filed on Nov. 15, 2005, which is incorporated by reference herein in its entirety.

BACKGROUND

1. Technical Field

The present invention relates generally to manufacturing a semiconductor device, and more specifically to a contact hole structure of a semiconductor device and a method of forming the same.

2. Description of the Related Art

Semiconductor devices are manufactured through repeated procedures of depositing and etching desired conductive layers and insulative layers. For example, a transistor having source/drain regions and a gate line is formed in a silicon substrate, an interlayer insulative film is covered thereon, and then a metallic wiring is formed. In this process, since the transistor and the metallic wiring formed thereon are separated from each other by the interlayer insulative film, a contact hole is formed in the interlayer insulative film and filled with a conductive material, thereby providing an electrical connection passageway.

FIGS. 1A and 1B are sectional views showing a contact hole structure of a semiconductor device and a manufacturing method of the same according to the prior art.

Referring to FIG. 1A, a gate oxide layer 11 and a gate line 12 are formed on a desired area of a silicon substrate 10 and then a low-concentration region of source/drain region 13 is formed in silicon substrate 10. Then, a sidewall spacer 14 is formed at both sides of gate line 12, and a high-concentration region of source/drain region 13 is formed in silicon substrate 10. Then, an etch stopper layer 15 is deposited to cover the entire silicon substrate 10, and an interlayer dielectric layer 16 is deposited thereon.

Next, as shown in FIG. 1B, desired portions of interlayer dielectric layer 16 and etch stopper layer 15 are etched to form contact holes 17a and 17b. Contact holes 17a and 17b serve as passageways for connecting source/drain region 13 and gate line 12 to a metallic wiring, which will subsequently be formed. The contact holes are formed simultaneously above gate line 12 and source/drain region 13. The formation of contact holes 17a and 17b comprises the steps of etching interlayer dielectric layer 16 and etch stopper layer 15. Dielectric layer 16 may be made of an oxide, and etch stopper layer 15 may be made of a nitride.

FIG. 1B shows an ideal structure of contact holes 17a and 17b. In practice, however, since two contact holes 17a and 17b are simultaneously formed at two different areas, unexpected defects often produced. FIG. 2 is a sectional view showing an example of defects occurring in the conventional contact hole structure and its manufacturing technology.

Referring to FIG. 2, contact hole 17a formed above gate line 12 has a relatively shallow etching depth, dependent on the thickness of gate line 12. Therefore, if etch stopper layer 15 does not have a high etch selectivity, then over-etching is difficult to avoid when etching interlayer dielectric layer 16 to form contact hole 17a above gate line 12. As indicated by numeral 18 in FIG. 2, a defective gate line having a damaged upper end portion is formed, leading to a change in the characteristics of the semiconductor device, lowering reliability and yield.

SUMMARY

Accordingly, embodiments consistent with the present invention are directed to providing a contact hole structure of a semiconductor device and a method of forming the same, in which, when etching and forming contact holes simultaneously above a gate line and a source/drain region, the contact hole above the gate line is prevented from being over-etched, thus avoiding damage of the gate line.

An embodiment consistent with the present invention provides a contact hole structure of a semiconductor device and a method of forming the same, in which a gate protective layer is formed on a gate line and thus over-etching is prevented during etching of contact holes.

The method of forming a contact hole of a semiconductor device consistent with an embodiment of the present invention comprises forming a gate line and a source/drain region in a silicon substrate; depositing an etch stopper layer on the silicon substrate; depositing a first interlayer dielectric layer on the etch stopper layer and flattening the first interlayer dielectric layer such that the upper end of the etch stopper layer placed above the gate line is exposed; removing the exposed portion of the etch stopper layer; forming a gate protective layer at the upper end of the gate line; depositing a second interlayer dielectric layer on the silicon substrate; and etching the second interlayer dielectric layer and the etch stopper layer consecutively to form contact holes on the gate line and the source/drain region, respectively, wherein, the gate line is protected by the gate protective layer when the second interlayer dielectric layer and the etch stopper layer are etched.

Preferably, the gate protective layer is electrically conductive and has a high etch selectivity. The gate protective layer may be formed of a metallic material or a metallic nitride.

The step of forming the gate protective layer at the upper end of the gate line may include the steps of depositing the gate protective layer to cover the entire silicon substrate, and selectively etching the deposited gate protective layer. The step of depositing the gate protective layer to cover the entire silicon substrate may be performed using a physical vapor deposition (PVD) process or a chemical vapor deposition (CVD) process.

Consistent with an embodiment of the present invention, the gate protective layer may be formed of titanium nitride (TiN). The step of depositing the gate protective layer to cover the entire silicon substrate may be performed through a physical vapor deposition process, which is carried out for about 35 seconds under conditions of 10,000 W of power, 10 sccm of Ar gas, and 45 sccm of nitrogen gas. In this step, the gate protective layer may be deposited to have a thickness of about 1000 Å.

Preferably, the same mask is used in selectively etching the deposited gate protective layer and forming a gate line and a source/drain region in a silicon substrate.

A reactive ion etching (RIE) process may be used in selectively etching the deposited gate protective layer. This step may be carried out for about 10 to 20 seconds under conditions of 700 W of source power, 100 W of bias power, 6 mT of pressure, 50 sccm of $Cl_2$ gas, and 30 sccm of $BCl_3$ gas.

The etch stopper layer may be formed of a silicon nitride (SiN), and a blank dry etch process may be used in removing the exposed portion of the etch stopper layer. The blank dry etch process may be carried out for about 50 to 60 seconds under conditions of 50 mT of pressure, 120 W of power, 180 sccm of Ar gas, and 5 sccm of $CF_4$ gas.

The first interlayer dielectric layer and the second interlayer dielectric layer may be formed of an identical material.

In addition, embodiments consistent with the present invention provide a contact hole structure of a semiconductor device formed by any one of the above-described methods.

DETAILED DESCRIPTION

Figure 1A:
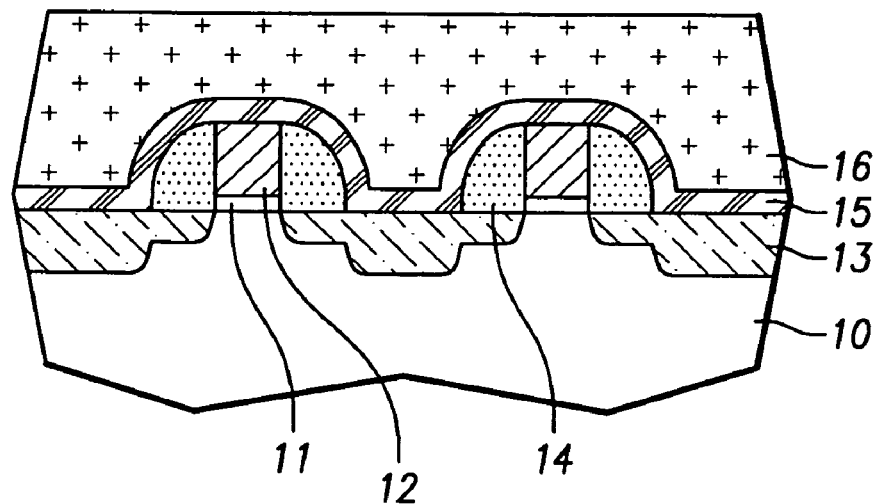
FIGS. 1A and 1B are sectional views showing a contact hole structure of a semiconductor device and a manufacturing method of the same according to the prior art.
Figure 1B:
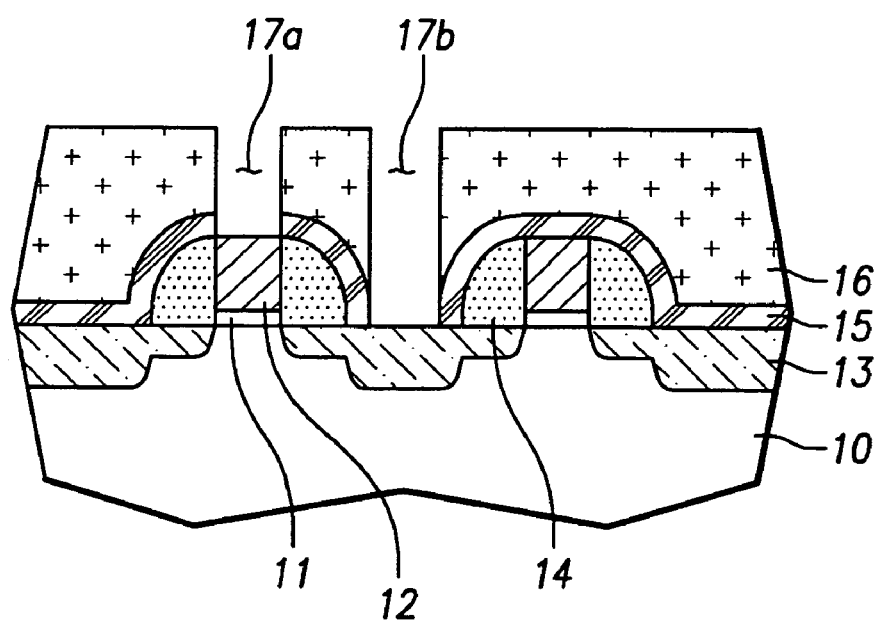
Figure 2:
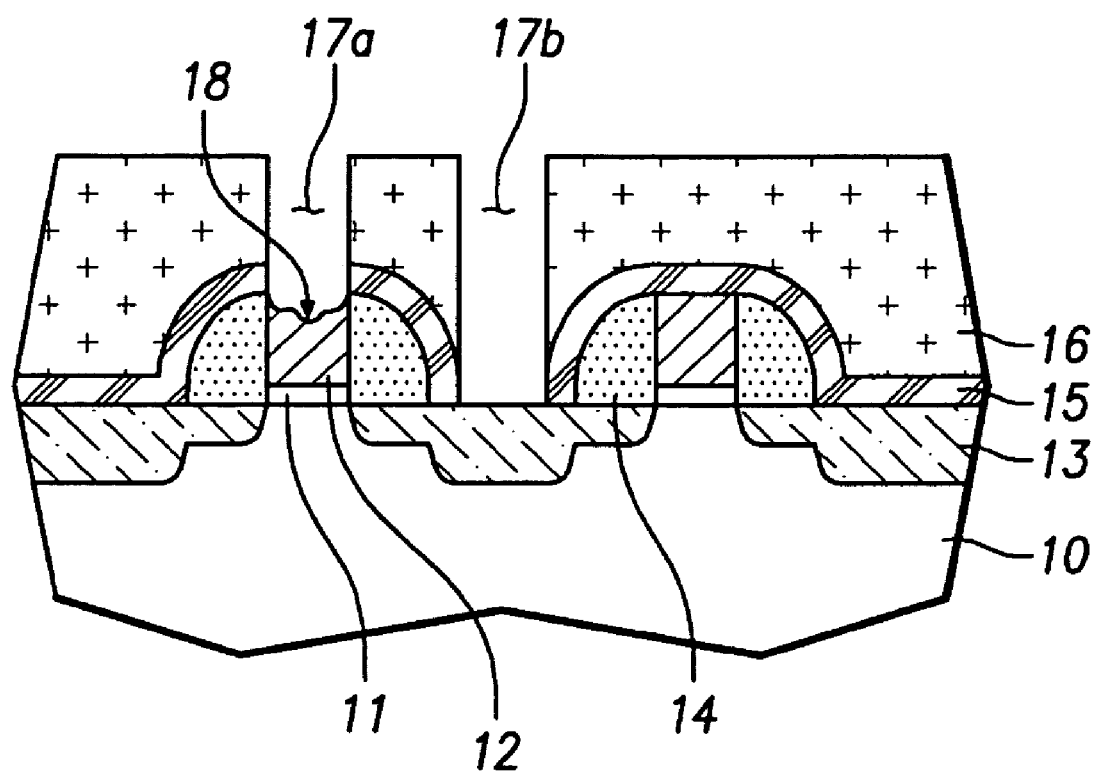
FIG. 2 is a sectional view showing a defective contact hole occurring in the conventional technology of FIGS. 1A and 1B according to the prior art.

Embodiments consistent with the present invention are explained in greater detail below, with references to the accompanying drawings.

In the explanation of embodiments below, details well-known in the art may be omitted. Furthermore, certain elements in the drawings may be exaggerated, omitted, or schematically illustrated, and does not necessarily reflect the real size.

FIGS. 3A through 3F are sectional views showing an exemplary contact hole structure of a semiconductor device and a method of forming the same consistent with an embodiment of the present invention.

Figure 3A:
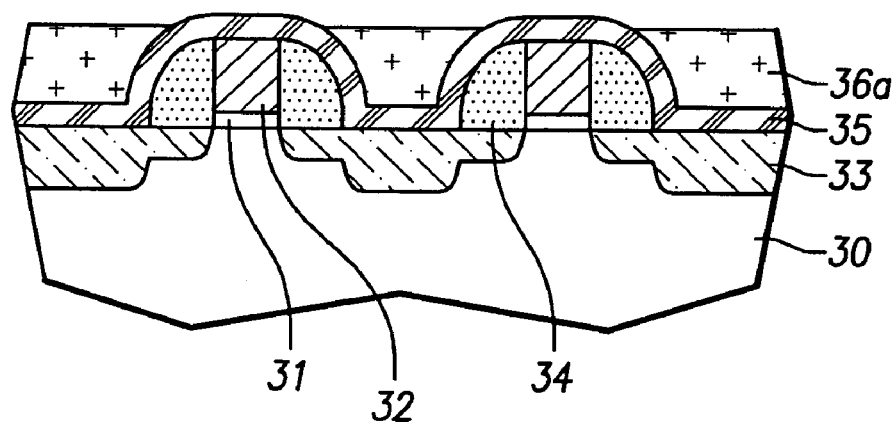
FIGS. 3A through 3F are sectional views showing an exemplary contact hole structure of a semiconductor device and a method of forming the same consistent with an embodiment of the present invention.

Referring to FIG. 3A, first, a gate oxide layer 31 and a gate line 32 are formed on desired areas of a silicon substrate 30, and then a low-concentration impurity region of source/drain region 33 is formed in silicon substrate 30. Then, a sidewall spacer 34 is formed at both sides of gate line 32 and a high-concentration impurity region of source/drain region 33 is formed in silicon substrate 30.

Subsequently, an etch stopper layer 35 is deposited to cover the entire silicon substrate 30, and a first interlayer dielectric layer 36a is deposited thereon. Etch stopper layer 35 is formed, for example, of silicon nitride and deposited to have a thickness of about 350 Å. First interlayer dielectric layer 36a is formed, for example, of an oxide, such as TEOS, and deposited to have a thickness of about a few thousand angstroms. First interlayer dielectric layer 36a is flattened such that a portion of etch stopper layer 35 deposited directly above gate line 32 is exposed.

Figure 3B:
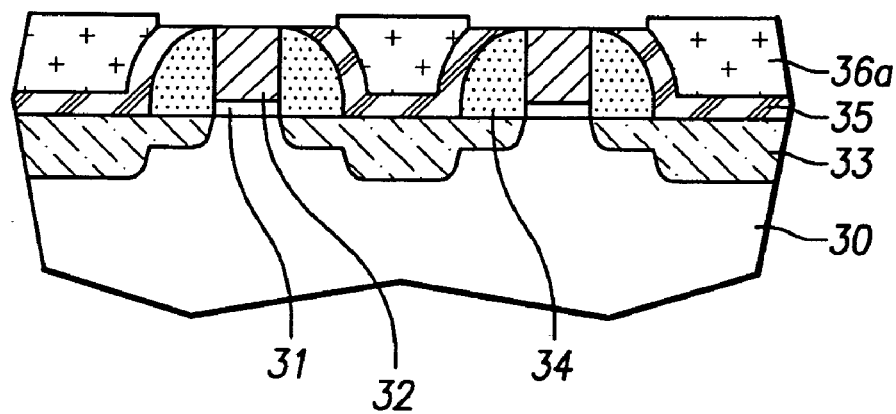

As shown in FIG. 3B, exposed etch stopper layer 35 is then removed using a blank dry etch process. For example, the blank dry etch process is carried out for about 50 to 60 seconds under the conditions of 50 mT of pressure, 120 W of power, 180 sccm of Ar gas, and 5 sccm of $CF_4$ gas.

Figure 3C:
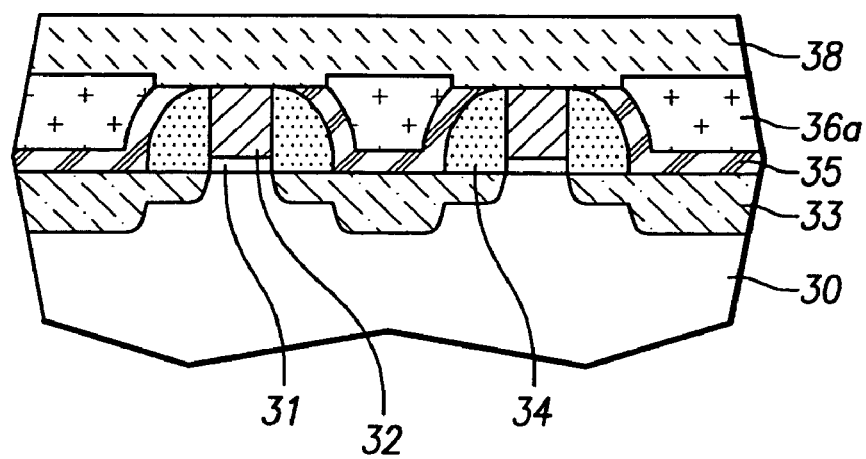

Then, as shown in FIG. 3C, a gate protective layer 38 is deposited to cover the entire silicon substrate 30. Gate protective layer 38 is electrically conductive and formed of a metallic material such as tungsten or a metallic nitride such as titanium nitride (TiN), providing a high etch selectivity at the subsequent step of etching a contact hole. The deposition of gate protective layer 38 can be performed through a well-known physical vapor deposition (PVD) or chemical vapor deposition (CVD) process. For example, deposition of TiN may be performed through a PVD process, which can be carried out for about 35 seconds under the condition of 10,000 W of power, 10 sccm of Ar gas, and 45 sccm of $N_2$ gas. Gate protective layer 38 is deposited to have a thickness of about 1000 Å.

Figure 3D:
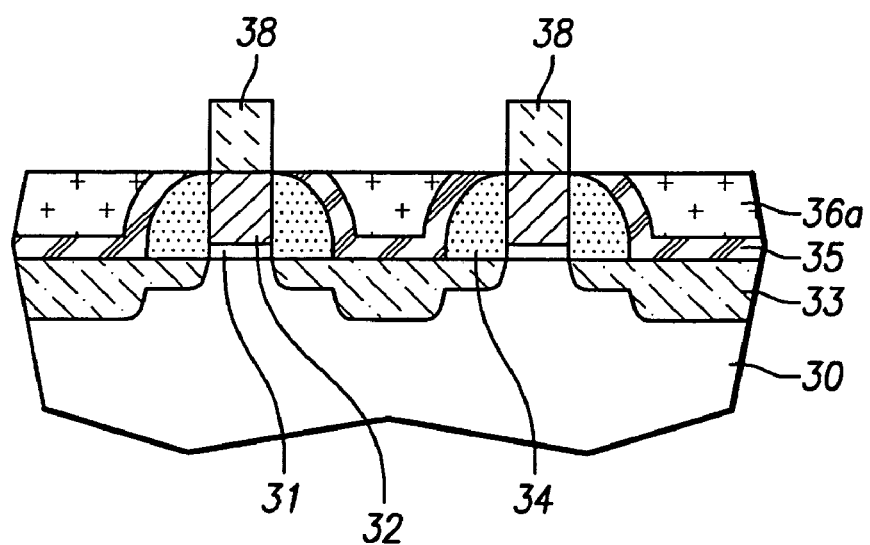

Next, as shown in FIG. 3D, gate protective layer 38 is selectively etched to form a pattern. Etching of gate protective layer 38 does not need a separate mask, but may employ the same mask as used in forming a gate line. Thus, gate protective layer 38 remains only on gate line 32. Etching of gate protective layer 38 is performed using a dry etching process such as a reactive ion etching (RIE) process. The RIE process can be carried out for about 10 to 20 seconds under the conditions of 700 W of power, 100 W of bias power, 6 mT of pressure, 50 sccm of $Cl_2$ gas, and 30 sccm of $BCl_3$ gas.

Figure 3E:
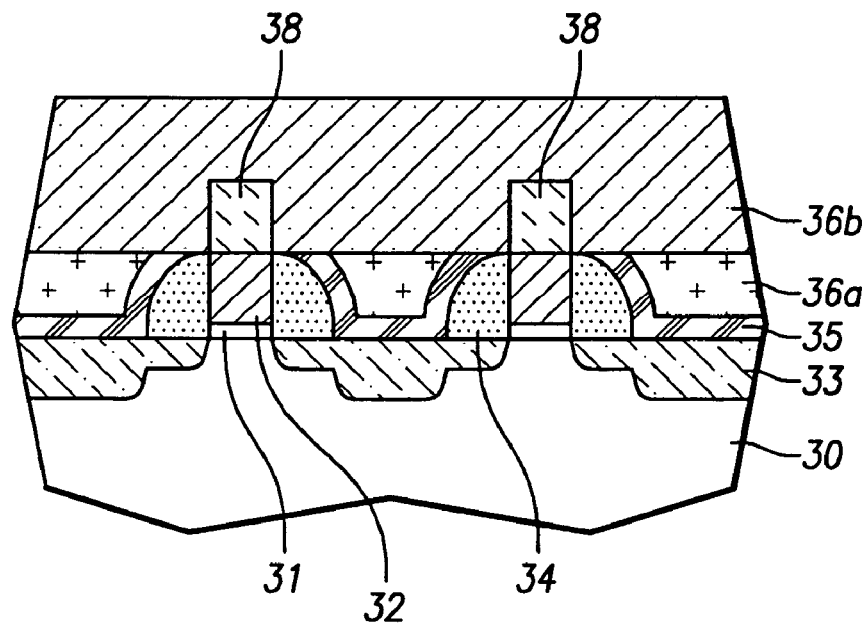

Thereafter, as shown in FIG. 3E, a second interlayer dielectric layer 36b is deposited to cover the entire silicon substrate 30. Preferably, second interlayer dielectric layer 36b is formed of the same material as first interlayer dielectric layer 36a, for example, an oxide such as TEOS. Second interlayer dielectric layer 36b is deposited to have a thickness of about a few thousand angstroms.

Figure 3F:
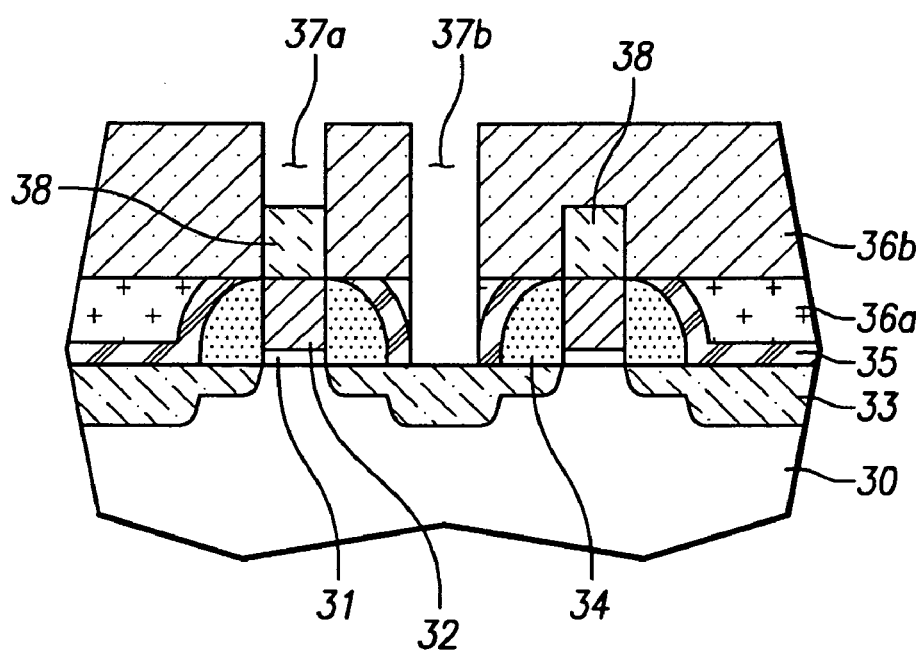

Next, as shown in FIG. 3F, second interlayer dielectric layer 36b is etched to form contact hole 37a. Second interlayer dielectric layer 36b, first interlayer dielectric layer 36a, and etch stopper layer 35 are also consecutively etched to form contact hole 37b. Contact hole 37a is formed above gate line 32 and contact hole 37b is formed above source/drain region 33 at the same time. In the etching process for forming contact holes 37a and 37b, even if contact holes 37a and 37b have different etching depths from each other, gate line 32 does not suffer damage, which may be otherwise caused by over-etching. This damage and over-etching is prevented because gate protective layer 38 placed at the upper end of gate line 32 is formed of a material having a higher etch selectivity than second interlayer dielectric layer 36b and etch stopper layer 35, thereby protecting gate line 32. On the other hand, because gate protective layer 38 is formed of an electrically conductive material, it does not cause any problems even if it remains inside contact hole 37b above gate line 32.

As described above, in the contact hole structure of a semiconductor device and the method of forming the same consistent with the present invention, a gate protective layer is formed on the gate line. Thus, when simultaneously etching the contact holes above the gate line and a source/drain region, damage to the gate line can be prevented, which may be otherwise caused by over-etching.

Thus, the prevent invention can avoid a change in the characteristics of a semiconductor device and improve reliability and yield.

Although the present invention has been described using specific terminologies with reference to several exemplary embodiments, the description is illustrative of the invention and intended to fully explain the invention, but not to be construed as limiting the invention. Various modifications, variations and replacements may be realized by those skilled in the art, without departing from the spirit and scope of the invention as defined by the appended claims.

What is claimed is:

1. A method of forming a contact hole of a semiconductor device, the method comprising the steps of:

forming a gate line and a source/drain region in a substrate;

depositing an etch stopper layer on the substrate;

depositing a first interlayer dielectric layer on the etch stopper layer and flattening the first interlayer dielectric layer such that a portion of the etch stopper layer above the gate line is exposed;

removing the exposed portion of the etch stopper layer;

forming a gate protective layer on the gate line;

depositing a second interlayer dielectric layer on the substrate; and etching the second interlayer dielectric layer to form a first contact hole on the gate line and consecutively etching the second interlayer dielectric layer, the first interlayer dielectric layer, and the etch stopper layer to form a second contact hole on the source/drain region, wherein the gate protective layer protects the gate line during the formation of the first contact hole and the second contact hole.

2. The method as claimed in claim 1, wherein the gate protective layer is electrically conductive and formed of a material having a high etch selectivity.

3. The method as claimed in claim 1, wherein the gate protective layer is formed of a metallic material or a metallic nitride.

4. The method as claimed in claim 1, wherein the gate protective layer is formed by depositing the gate protective layer to cover the entire substrate and selectively etching the deposited gate protective layer.

5. The method as claimed in claim 4, wherein the gate protective layer is deposited by a physical vapor deposition (PVD) process or a chemical vapor deposition (CVD) process.

6. The method as claimed in claim 4, wherein the gate protective layer is formed of titanium nitride (TiN).

7. The method as claimed in claim 6, wherein the gate protective layer is deposited using a physical vapor deposition process carried out for about 35 seconds under conditions of about 10,000 W of power, about 10 sccm of Ar gas, and about 45 sccm of nitrogen gas.

8. The method as claimed in claim 4, wherein the gate protective layer is deposited to have a thickness of about 1000 Å.

9. The method as claimed in claim 4, wherein:
forming the gate line comprises using a make; and
the deposited gate protective layer is selectively etched using the same mask used in forming the gate line.

10. The method as claimed in claim 4, wherein the deposited gate protective layer is selectively etched using a reactive ion etching (RIE) process.

11. The method as claimed in claim 10, wherein selectively etching the deposited gate protective layer is carried out for about 10 to 20 seconds under conditions of 700 W of source power, 100 W of bias power, 6 mT of pressure, 50 sccm of $Cl_2$ gas, and 30 sccm of $BCl_3$ gas.

12. The method as claimed in claim 1, wherein the etch stopper layer is formed of a silicon nitride (SiN).

13. The method as claimed in claim 12, wherein the exposed portion of the etch stopper layer is removed using a blank dry etch process.

14. The method as claimed in claim 13, wherein the blank dry etch process is carried out for about 50 to 60 seconds under conditions of 50 mT of pressure, 120 W of power, 180 sccm of Ar gas, and 5 sccm of $CF_4$ gas.

15. The method as claimed in claim 1, wherein the first interlayer dielectric layer and the second interlayer dielectric layer are formed of an identical material.

16. A contact hole structure of a semiconductor device formed by the method as claimed in claim 1.

* * * * *